United States Patent
Ching et al.

(10) Patent No.: US 10,269,901 B2
(45) Date of Patent: Apr. 23, 2019

(54) SEMICONDUCTOR LINER OF SEMICONDUCTOR DEVICE

(71) Applicant: Taiwan Semiconductor Manufacturing Company, Ltd., Hsin-Chu (TW)

(72) Inventors: Kuo-Cheng Ching, Zhubei (TW); Chih-Hao Wang, Baoshan Township (TW); Carlos H. Diaz, Mountain View, CA (US)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 81 days.

(21) Appl. No.: 15/402,042

(22) Filed: Jan. 9, 2017

(65) Prior Publication Data

US 2017/0117364 A1    Apr. 27, 2017

Related U.S. Application Data

(60) Division of application No. 14/831,692, filed on Aug. 20, 2015, now Pat. No. 9,543,418, which is a (Continued)

(51) Int. Cl.
*H01L 29/10*     (2006.01)
*H01L 29/78*     (2006.01)
(Continued)

(52) U.S. Cl.
CPC ...... *H01L 29/1054* (2013.01); *H01L 21/0262* (2013.01); *H01L 21/02236* (2013.01);
(Continued)

(58) Field of Classification Search
CPC .............. H01L 29/1054; H01L 29/267; H01L 29/7851; H01L 29/165; H01L 29/66795; H01L 21/02236; H01L 29/0653
See application file for complete search history.

(56) References Cited

U.S. PATENT DOCUMENTS 8,237,226 B2   8/2012  Okano
8,629,500 B2   1/2014  Holz et al.
(Continued)

FOREIGN PATENT DOCUMENTS

CN   102054741 A   5/2011
CN   102446972 A   5/2014
(Continued)

*Primary Examiner* — Jessica S Manno
*Assistant Examiner* — Mohammed R Alam
(74) *Attorney, Agent, or Firm* — Slater Matsil, LLP

(57) ABSTRACT

The disclosure relates to a fin field effect transistor (FinFET) formed in and on a substrate having a major surface. The FinFET includes a fin structure protruding from the major surface, which fin includes a lower portion, an upper portion, and a middle portion between the lower portion and upper portion, wherein the fin structure includes a first semiconductor material having a first lattice constant; a pair of notches extending into opposite sides of the middle portion; and a semiconductor liner adjoining the lower portion. The semiconductor liner is a second semiconductor material having a second lattice constant greater than the first lattice constant.

20 Claims, 6 Drawing Sheets

Related U.S. Application Data continuation-in-part of application No. 14/144,219, filed on Dec. 30, 2013, now Pat. No. 9,142,676.

(51) Int. Cl.
  *H01L 29/66* (2006.01)
  *H01L 21/02* (2006.01)
  *H01L 29/06* (2006.01)
  *H01L 29/165* (2006.01)
  *H01L 29/36* (2006.01)
  *H01L 29/267* (2006.01)

(52) U.S. Cl.
  CPC .. *H01L 21/02381* (2013.01); *H01L 21/02521* (2013.01); *H01L 21/02532* (2013.01); *H01L 29/0653* (2013.01); *H01L 29/0657* (2013.01); *H01L 29/165* (2013.01); *H01L 29/267* (2013.01); *H01L 29/36* (2013.01); *H01L 29/66795* (2013.01); *H01L 29/66818* (2013.01); *H01L 29/785* (2013.01); *H01L 29/7848* (2013.01); *H01L 29/7849* (2013.01); *H01L 29/7851* (2013.01); *H01L 21/02579* (2013.01)

(56) References Cited

U.S. PATENT DOCUMENTS

| | | |
|---|---|---|
| 8,716,074 B2 | 5/2014 | Maszara et al. |
| 8,759,943 B2 | 6/2014 | Tseng et al. |
| 9,006,786 B2 | 4/2015 | Ching et al. |
| 9,142,676 B2 | 9/2015 | Ching et al. |
| 2008/0105932 A1 | 5/2008 | Liaw |
| 2009/0256208 A1* | 10/2009 | Okano ............... H01L 21/324 257/365 |
| 2010/0144121 A1* | 6/2010 | Chang ............... H01L 29/1054 438/478 |
| 2011/0097889 A1 | 4/2011 | Yuan et al. |
| 2012/0086053 A1 | 4/2012 | Tseng et al. |
| 2012/0292672 A1 | 11/2012 | Cho |
| 2013/0234215 A1* | 9/2013 | Okano ............... H01L 29/42392 257/255 |
| 2014/0031336 A1 | 1/2014 | Amans et al. |
| 2014/0299882 A1 | 10/2014 | Chan et al. |
| 2015/0008483 A1 | 1/2015 | Ching et al. |
| 2015/0021681 A1 | 1/2015 | Hou |

FOREIGN PATENT DOCUMENTS

| | | |
|---|---|---|
| JP | 2009259865 A | 11/2009 |
| KR | 20070095062 A | 9/2007 |
| KR | 1020070095062 A | 9/2007 |

* cited by examiner

US 10,269,901 B2

SEMICONDUCTOR LINER OF SEMICONDUCTOR DEVICE

PRIORITY CLAIM

This application is a divisional of U.S. patent application Ser. No. 14/831,692, filed on Aug. 20, 2015, and entitled "Semiconductor Liner of Semiconductor Device" which claims the benefit of and is a continuation of U.S. patent application Ser. No. 14/831,692, filed on Aug. 20, 2015, and entitled "Semiconductor Liner of Semiconductor Device," which application claims the benefit of and is a continuation of U.S. patent application Ser. No. 14/144,219 filed on Dec. 30, 2013, now U.S. Pat. No. 9,142,676 issued on Sep. 22, 2015, and entitled "Semiconductor Liner of Semiconductor Device" both which applications are incorporated herein by reference.

TECHNICAL FIELD

The disclosure relates to integrated circuit fabrication, and more particularly to a semiconductor device with a semiconductor liner.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, it is difficult to achieve enhanced carrier mobility for a FinFET if strained materials can not deliver a given amount of strain into channel region of the FinFET, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
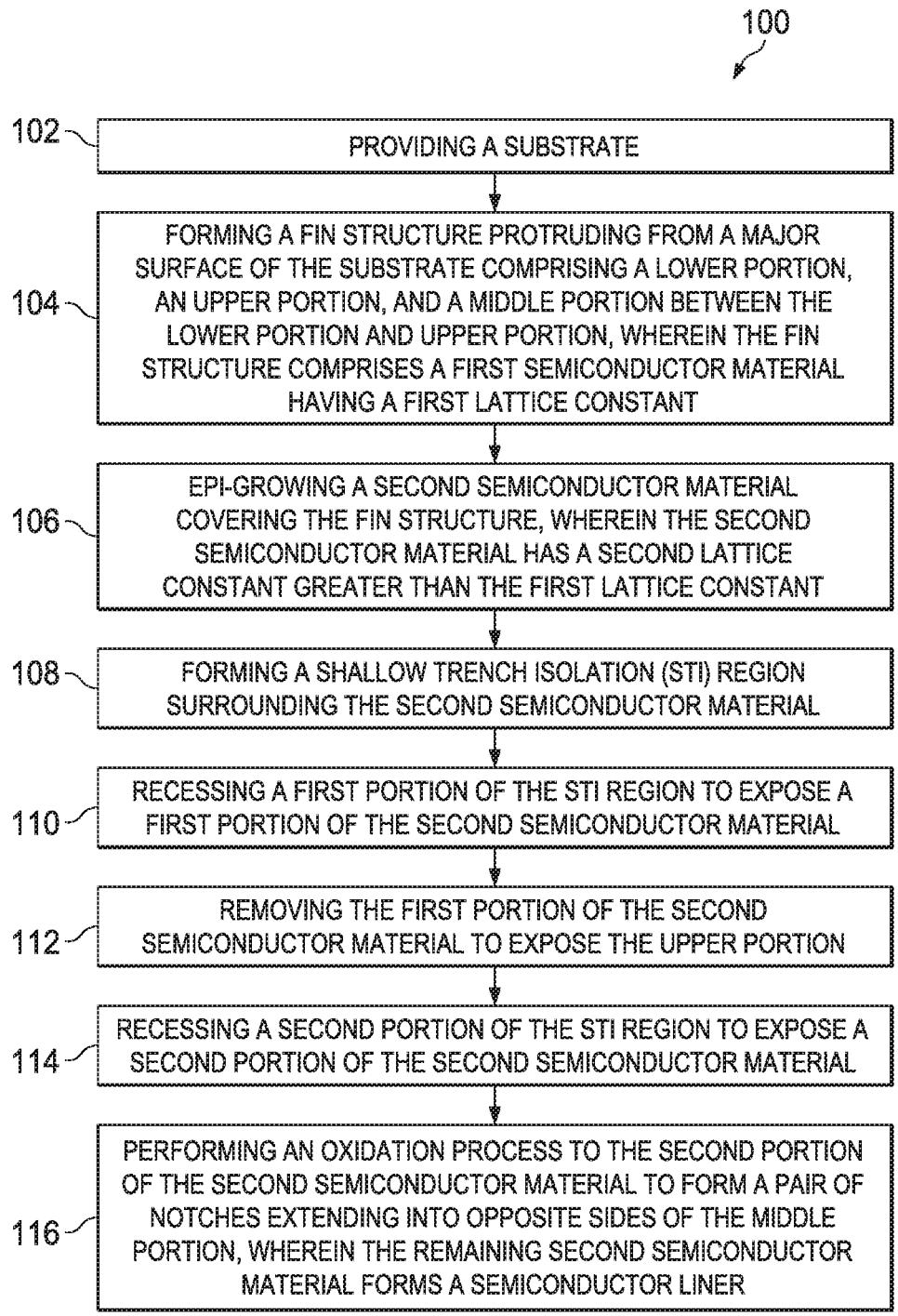
FIG. 1 is a flowchart illustrating a method of fabricating a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a semiconductor device according to various aspects of the present disclosure. The method 100 begins with step 102 in which a substrate is provided. The method 100 continues with step 104 in which a fin structure is formed protruding from a major surface of the substrate comprising a lower portion, an upper portion, and a middle portion between the lower portion and upper portion, wherein the fin structure comprises a first semiconductor material having a first lattice constant. The method 100 continues with step 106 in which a second semiconductor material is epi-grown covering the fin structure, wherein the second semiconductor material has a second lattice constant greater than the first lattice constant.

The method 100 continues with step 108 in which a shallow trench isolation (STI) region is formed surrounding the second semiconductor material. The method 100 continues with step 110 in which a first portion of the STI region is recessed to expose a first portion of the second semiconductor material. The method 100 continues with step 112 in which the first portion of the second semiconductor material is removed to expose the upper portion. The method 100 continues with step 114 in which a second portion of the STI region is recessed to expose a second portion of the second semiconductor material.

The method 100 continues with step 116 in which an oxidation process is performed to the second portion of the second semiconductor material to form a pair of notches extending into opposite sides of the middle portion, wherein the remaining second semiconductor material forms a semiconductor liner. The discussion that follows illustrates embodiments of semiconductor devices that can be fabricated according to the method 100 of FIG. 1.

Figure 2:
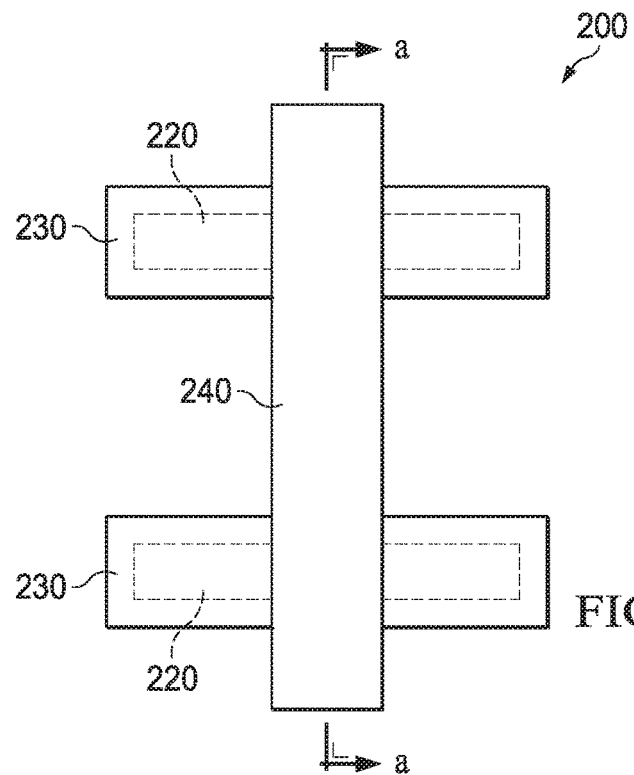
FIG. 2 shows a top view of a semiconductor device comprising a semiconductor liner according to various aspects of the present disclosure.

FIG. 2 shows a top view of a semiconductor device 200 comprising a semiconductor liner 230 according to various aspects of the present disclosure. FIGS. 3-11 are cross-sectional views of a semiconductor device 200 at various stages of fabrication according to various embodiment of the present disclosure. As employed in the present disclosure, the term semiconductor device 200 refers to a fin field effect transistor (FinFET) and is hereinafter referred to as FinFET 200. The FinFET 200 refers to any fin-based, multi-gate transistor. Other transistor structures and analogous structures are within the contemplated scope of the disclosure. The FinFET 200 may be included in a microprocessor, memory cell, and/or other integrated circuit (IC).

It is noted that the method of FIG. 1 does not produce a completed FinFET 200. A completed FinFET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 11 are simplified for a better understanding of the concepts of the present disclosure. For example, although the figures illustrate the FinFET 200, it is understood the IC may comprise a number of other devices comprising resistors, capacitors, inductors, fuses, etc.

FIG. 2 illustrates a FinFET 200 fabricated using the steps in FIG. 1. For illustration, the FinFET 200 comprises a fin structure 220 (dashed line), a semiconductor liner 230 surrounding the fin structure 220, and a gate structure 240 traversing over channel portion of the fin structure 220. For illustration, the FinFET 200 comprises two fins. In some embodiments, the FinFET 200 may comprise less than or greater than two fins, for example, one fin or three fins.

Figure 3:
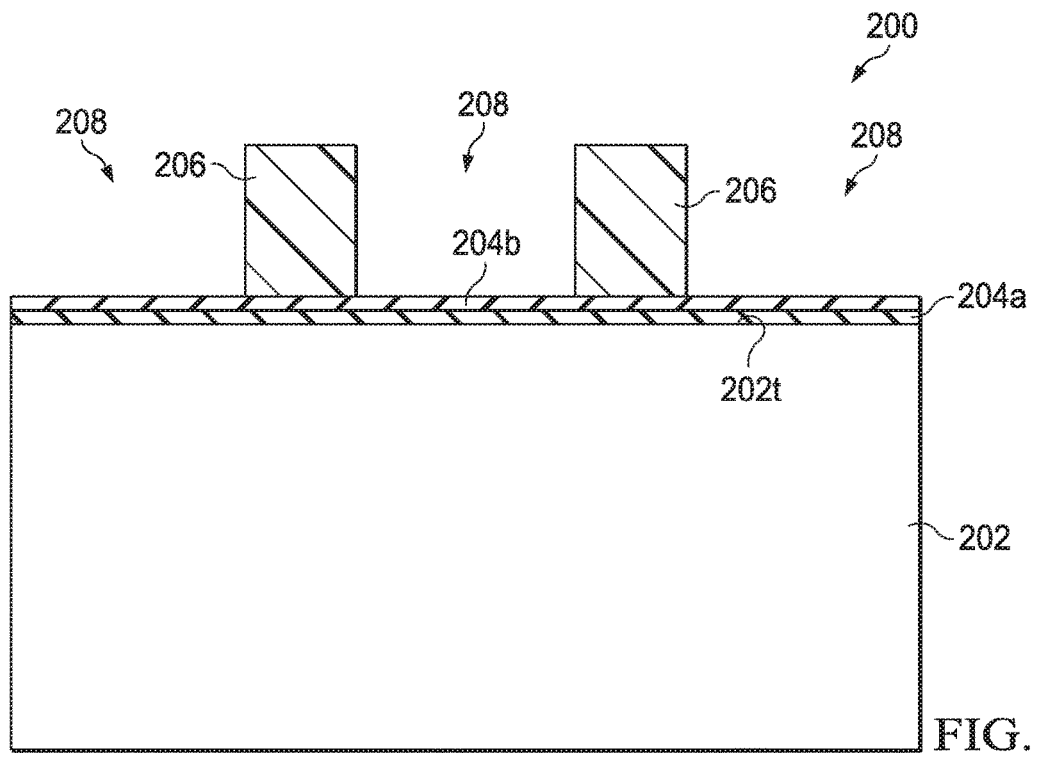
FIGS. 3-11 are cross-sectional views of a semiconductor device at various stages of fabrication according to various embodiment of the present disclosure.

As depicted in FIG. 3 and step 102 in FIG. 1, a substrate 202 is provided, wherein the substrate 202 comprise a first semiconductor material having a first lattice constant and hence is also referred to as first semiconductor material 202 in the present disclosure. In one embodiment, the substrate 202 comprises a semiconductor substrate (e.g., a crystalline silicon substrate). In alternative embodiment, the substrate 202 comprises a silicon-on-insulator (SOI) structure. The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In one embodiment, a pad layer 204a and a mask layer 204b are formed on a top surface 202t of the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In an embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A photo-sensitive layer 206 is formed on the mask layer 204b and is then patterned, forming openings 208 in the photo-sensitive layer 206.

Figure 4:
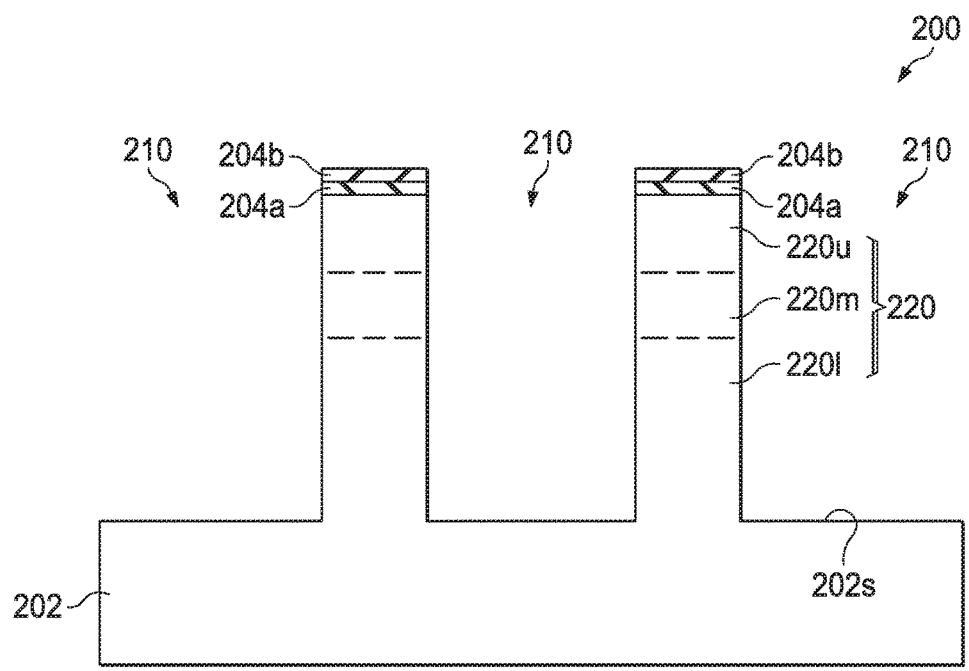

As depicted in FIG. 4 and step 104 in FIG. 1, the structure in FIG. 4 is produced by forming the fin structure 220 protruding from a major surface 220s of the substrate 202 comprising a lower portion 220l, an upper portion 220u, and a middle portion 220m between the lower portion 220l and upper portion 220u, wherein the fin structure 220 comprises the first semiconductor material 202 having the first lattice constant. In some embodiments, the first semiconductor material 202 is replaced by other semiconductor material to enhance device performance.

In some embodiments, the mask layer 204b and pad layer 204a are etched through openings 208 to expose underlying semiconductor substrate 202. The exposed semiconductor substrate 202 is then etched to form trenches 210 with the major surfaces 202s of the semiconductor substrate 202. Portions of the semiconductor substrate 202 between trenches 210 form the fin structure 220. In some embodiments, the trenches 210 may be strips (viewed from in the top of the FinFET 200) parallel to each other, and closely spaced with respect to each other. In some embodiments, the trenches 210 may be continuous and surrounding the fin structure 220.

In the depicted embodiment, the fin structure 220 protruding from the substrate major surface 202s comprises two fins. Further, each fin of the fin structure 220 may comprise a lower portion 220l, an upper portion 220u, and a middle portion 220m between the lower portion 220l and upper portion 220u. The photo-sensitive layer 206 is then removed. Next, a cleaning may be performed to remove a native oxide of the semiconductor substrate 202. The cleaning may be performed using diluted hydrofluoric (DHF) acid.

Liner oxide (not shown) is then optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces the electrical fields, and hence improves the performance of the resulting integrated circuit.

The process steps up to this point have provided the substrate 202 having the fin structure 220 protruding from the major surface 202s. Conventionally, a shallow trench isolation (STI) region is formed surrounding the fin structure 220 and then recessed to expose the channel portion of the fin structure 220. Then, a gate is provided over (e.g., wrapping) the fin. Having a gate on both sides of the channel allows gate control of the channel from both sides. However, it is difficult to achieve enhanced carrier mobility for a FinFET if there is no strained material to deliver a given amount of strain into channel region of the FinFET, thereby increasing the likelihood of device failure.

Accordingly, the processing discussed below with reference to FIGS. 5-10 may form a semiconductor liner (with greater lattice constant) adjoining the lower portion 220l of the fin structure 220 (with less lattice constant) to deliver a given amount of strain into channel region of the FinFET. Thus, Applicant's method may achieve the desired device performance characteristics, such as saturation current.

Figure 5:
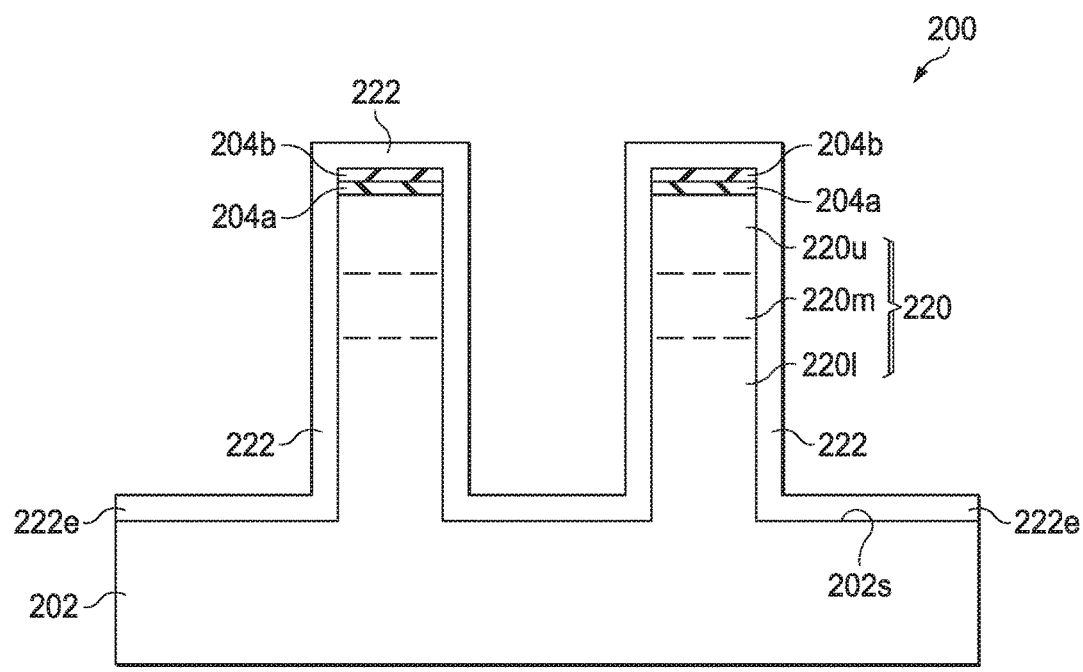

As depicted in FIGS. 5-10, for forming a semiconductor liner (such as semiconductor liner 230 shown in FIG. 10) adjoining the lower portion 220l, the structure in FIG. 5 is produced by epi-growing a second semiconductor material 222 (such as SiGe or SiGeB) covering the fin structure 220 (step 106 in FIG. 1), wherein the second semiconductor material 222 has a second lattice constant greater than the first lattice constant. In some embodiments, the second semiconductor material 222 has a thickness ranging from about 0.5 nm to about 2 nm. In some embodiments, a boron concentration of the second semiconductor material 222 (such as SiGeB) is from about $1*10^{19}$ to about $5*10^{20}$ atoms/cm$^3$.

In the depicted embodiment, the second semiconductor material 222 (such as SiGe or SiGeB) is selectively grown by a LPCVD process. In one embodiment, the LPCVD process is performed at a temperature of about 350° C. to about 800° C. and under a pressure of about 1 Torr to about 200 Torr, using $SiH_4$, $Si_2H_6$, $GeH_4$, $Ge_2H_6$, HCl, $B_2H_6$, and $H_2$ as reaction gases.

In the depicted embodiment, the second semiconductor material 222 further comprises a portion 222e extending to the major surface 202s. In some embodiments, an anisotropic etching process may be performed on the second semiconductor material 222 to form a pair of sidewall semiconductor on two sides of the fin structure 220 (not shown). As such, the pair of sidewall semiconductor does not comprise a portion extending to the major surface 202s. In some embodiments, the anisotropic etching process may be performed using HCl as an etching gas.

Figure 6:
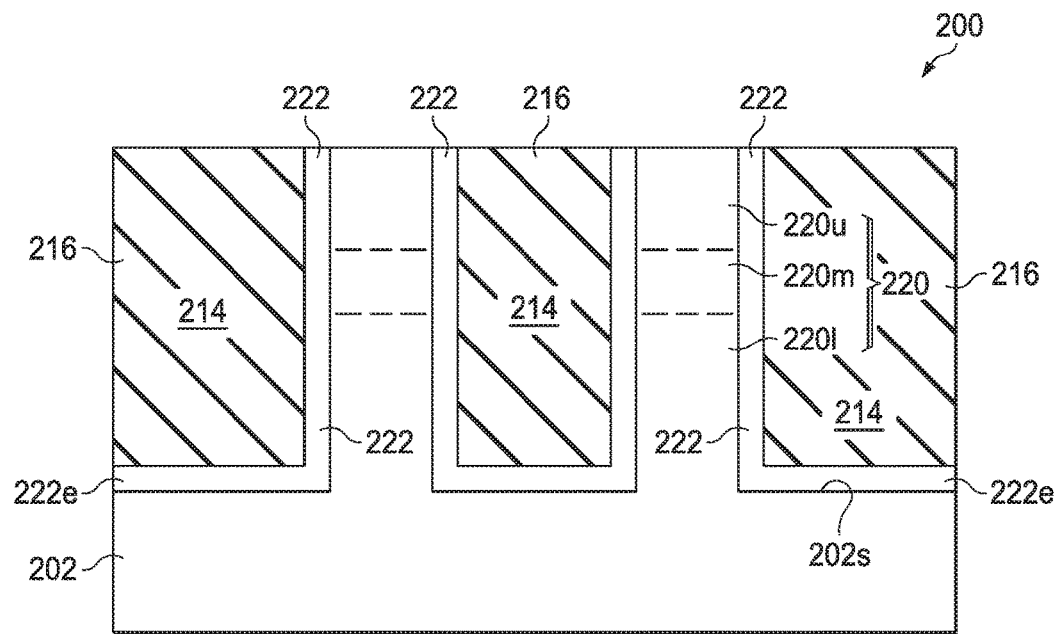

As depicted in FIG. 6 and step 108 in FIG. 1, after forming the second semiconductor material 222 covering the fin structure 220, the structure in FIG. 6 is produced by forming a shallow trench isolation (STI) region 216 surrounding the second semiconductor material 222.

In some embodiments, the trenches 210 are filled with a dielectric material 214. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used. In some embodiments, the oxide 214 may be formed using a high-density-plasma (HDP) CVD process, using silane ($SiH_4$) and oxygen ($O_2$) as reacting precursors. In other embodiment, the oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 214 may be formed using a spin-on-dielectric (SOD) process, such as hydrogen silsesquioxane (HSQ) or methyl silsesquioxane (MSQ).

A chemical mechanical polish is then performed to form the STI regions 216, followed by the removal of the mask layer 204b and pad layer 204a. In one embodiment, the mask layer 204b is formed of silicon nitride, the mask layer 204b may be removed using a wet process using hot $H_3PO_4$, while pad layer 204a may be removed using diluted HF acid, if formed of silicon oxide.

Figure 7:
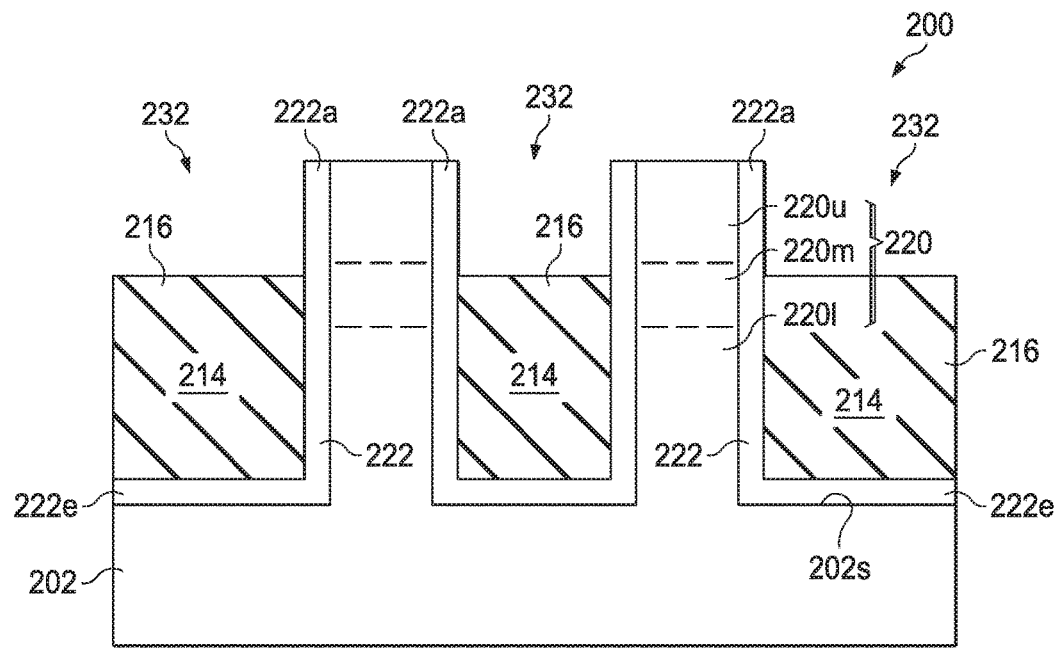

As depicted in FIG. 7 and step 110 in FIG. 1, after forming the STI region 216 surrounding the second semiconductor material 222, the structure in FIG. 7 is produced by recessing a first portion of the STI region 216 to expose a first portion 222a of the second semiconductor material 222, resulting in recesses 232. In some embodiments, the recessing step may be performed using a wet etching process, for example, by dipping the substrate 202 in hydrofluoric acid (HF). In some embodiments, the recessing step may be performed using a dry etching process, for example, the dry etching process may be performed using $CHF_3$ or $BF_3$ as etching gases.

Figure 8:
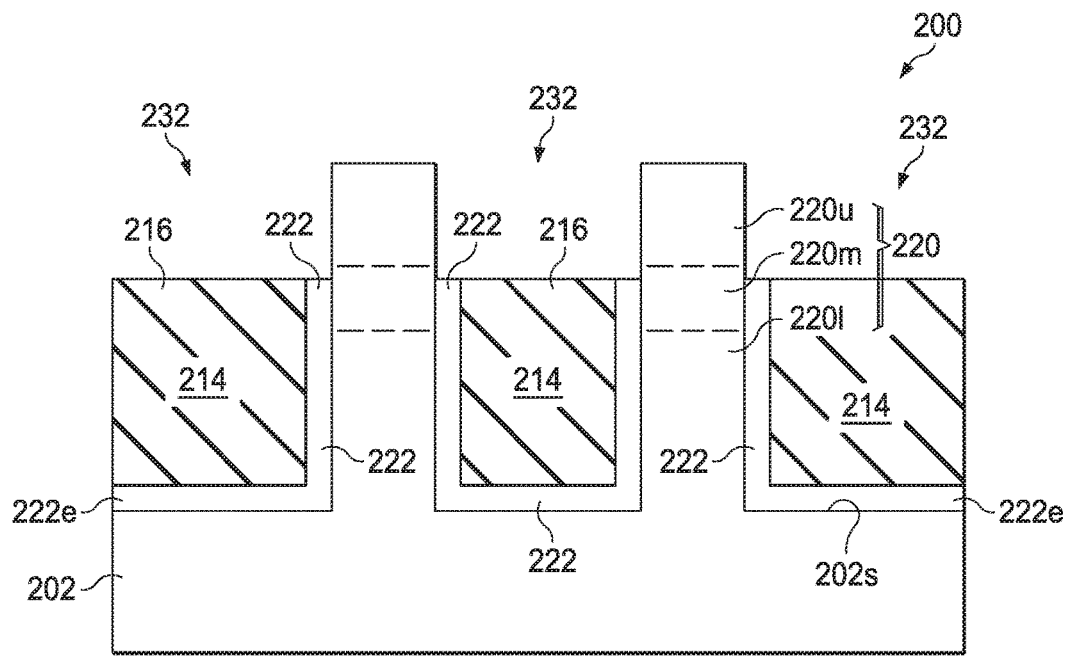

Next, the structure of FIG. 8 is produced by removing the first portion 222a of the second semiconductor material 222 to expose the upper portion 220u (step 112 in FIG. 1). In some embodiments, the removing step may be performed using a dry etching process, for example, the dry etching process may be performed using HCl as an etching gas. In the depicted embodiment, the upper portion 220u comprises source/drain (S/D) portions and a channel portion between the S/D portions. The channel portion is used to form channel region of the FinFET 200.

Figure 9:
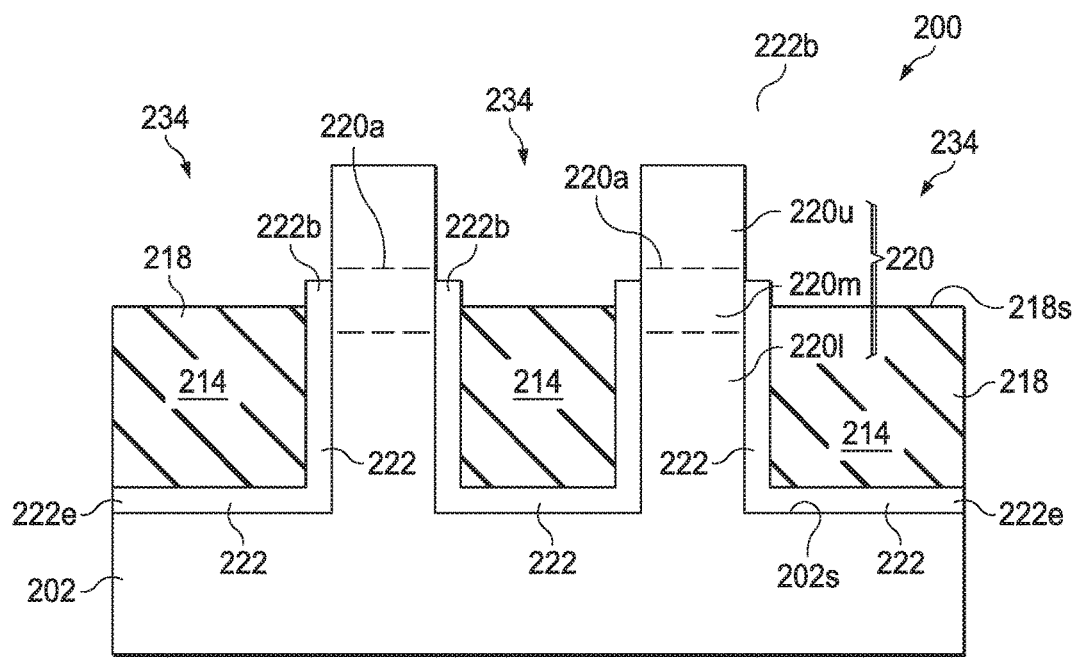

As depicted in FIG. 9 and step 114 in FIG. 1, after removing the first portion 222a of the second semiconductor material 222, the structure in FIG. 9 is produced by recessing a second portion of the STI region 216 to expose a second portion 222b of the second semiconductor material 222, resulting in recesses 234 and a remaining oxide 214. The remaining oxide 214 surrounding the second semiconductor material 222 is hereinafter referred to as an isolation structure 218, wherein a top surface 218s of the isolation structure 218 is lower than an interface 220a between the upper portion 220u and middle portion 220m. In some embodiments, the etching step may be performed using a wet etching process, for example, by dipping the substrate 202 in hydrofluoric acid (HF). In some embodiments, the etching step may be performed using a dry etching process, for example, the dry etching process may be performed using $CHF_3$ or $BF_3$ as etching gases.

Figure 10:
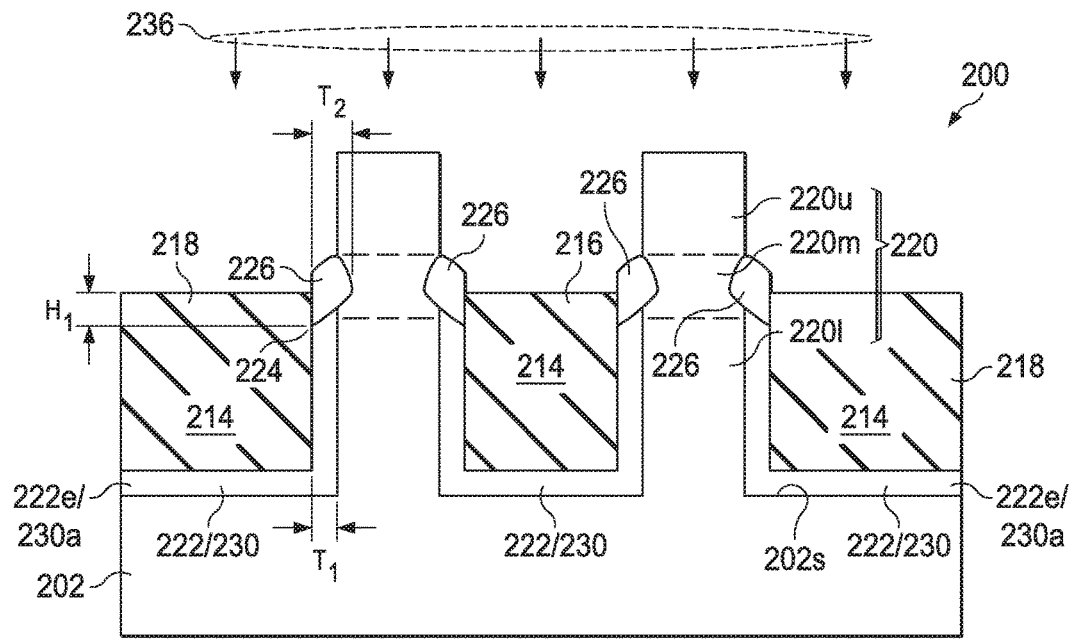
Figure 11:
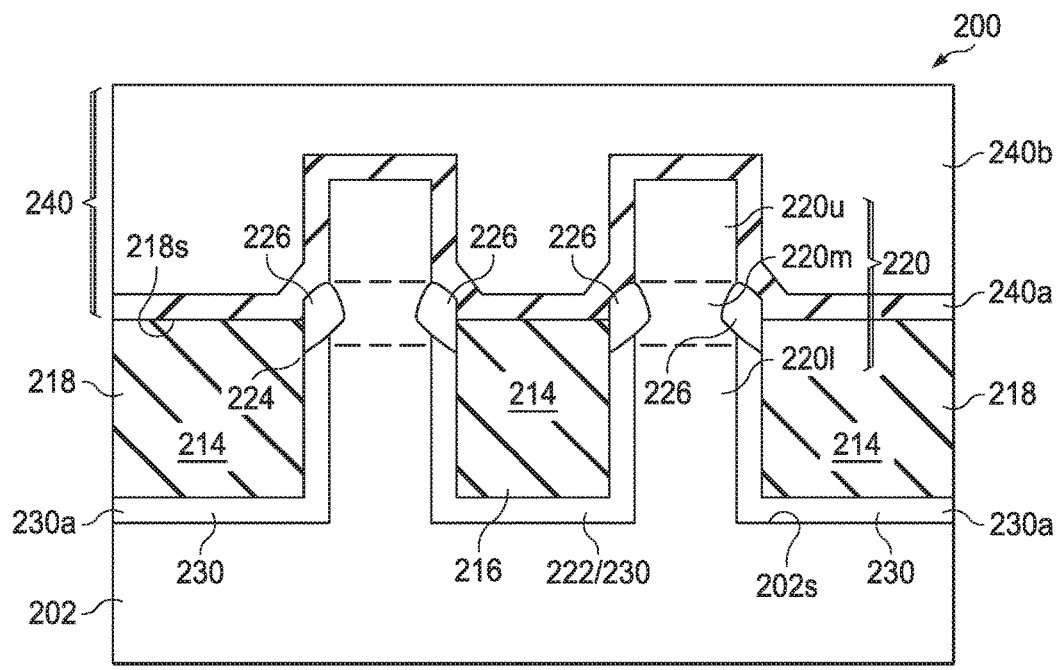

As depicted in FIG. 10 and step 116 in FIG. 1, for fabricating the semiconductor liner 230 adjoining the lower portion 220l, the structure in FIG. 10 is produced by performing an oxidation process 236 to the second portion 222b of the second semiconductor material 222 to form a pair of notches 226 extending into opposite sides of the middle portion 220m and a remaining second semiconductor material 222, wherein the remaining second semiconductor material 222 forms the semiconductor liner 230. In some embodiments, the semiconductor liner 230 further comprises a portion 230a (i.e., the portion 222e) extending to the major surface 202s. In some embodiments, the semiconductor liner 230 does not comprise a portion extending to the major surface 202s.

In the depicted embodiment, the pair of notches 226 may narrower carrier transportation path in each fin itself. Problems associated with high leakage current due to poor isolation may be reduced and/or avoided. Further, the semiconductor liner 230 (such as the second semiconductor material 222 with greater lattice constant) adjoining the lower portion 220l of the fin structure 220 (such as the first semiconductor material 202 with less lattice constant) may deliver a given amount of strain into channel region of the FinFET 200. Thus, Applicant's method may achieve the desired device performance characteristics, such as saturation current.

In some embodiments, the step of performing the oxidation process 236 to the second portion 222b of the second semiconductor material 222 to form a pair of notches 226 extending into opposite sides of the middle portion 220m is performed at a temperature of about 500° C. to about 600° C. and under a pressure of about 1 atm to about 20 atm, using $O_2$, $O_3$, or $H_2O$ as a reaction gas.

As a result of the oxidation, rather than oxidizing outer surfaces of the upper portion 220u (with low strain or no strain), the pair of notches 226 is generated adjacent to the semiconductor liner 230 (with high strain). In some embodiments, the pair of notches 226 extends into the second portion 222b of the second semiconductor material 222 (i.e., in a downward direction). In some embodiments, the pair of notches 226 further extends into opposite sides of the middle portion 220m (i.e., in an inward direction) due to increasing surface strain of the middle portion 220m from the second portion 222b of the second semiconductor material 222.

As such, a first thickness $T_1$ of the semiconductor liner is less than a second thickness $T_2$ of one of the pair of notches 226. In some embodiments, a ratio of the first thickness $T_1$ to the second thickness $T_2$ is from about 0.2 to about 0.9. In some embodiments, the pair of notches 226 comprises $SiGeO_x$ or $SiGeBO_y$. In some embodiments, the top surface 218s of the isolation structure 218 is higher than a contact peak 224 of the semiconductor liner 230 and one of the pair of notches 226. In some embodiments, a height difference $H_1$ between the top surface 218s and the contact peak 224 is from about 1 nm to about 10 nm.

In the depicted embodiment, the FinFET 200 comprises the substrate 202 comprising the major surface 202s; the fin structure 220 protruding from the major surface 202s comprising the lower portion 220l, the upper portion 220u, and the middle portion 220m between the lower portion 220l and upper portion 220u, wherein the fin structure 220 comprises the first semiconductor material 202 having the first lattice constant; the pair of notches 226 extending into opposite sides of the middle portion 220m; the semiconductor liner 230 adjoining the lower portion 220l comprising the second semiconductor material 222 having the second lattice constant greater than the first lattice constant; and the isolation structure 218 surrounding the semiconductor liner 230, wherein the top surface 218s of the isolation structure 218 is higher than the contact peak 224 of the semiconductor liner 230 and one of the pair of notches 226. In some embodiments, a gate structure 240 comprising a gate dielectric 240a and a gate electrode 240b traverses over channel portion of the fin structure 220 (shown in FIG. 11).

As such, using the semiconductor liner 230 to deliver a given amount of strain into channel region of the FinFET 200, problems associated with low carrier mobility for the FinFET 200 due to low strain may be reduced and/or avoided. Thus, Applicant's method may achieve the desired device performance characteristics, such as saturation current.

It is understood that the FinFET 200 may undergo further CMOS processes to form various features such as contacts/vias, interconnect metal layers, dielectric layers, passivation layers, etc.

In accordance with embodiments, a fin field effect transistor (FinFET) comprises a substrate comprising a major surface; a fin structure protruding from the major surface comprising a lower portion, an upper portion, and a middle portion between the lower portion and upper portion, wherein the fin structure comprises a first semiconductor material having a first lattice constant; a pair of notches extending into opposite sides of the middle portion; and a semiconductor liner adjoining the lower portion comprising a second semiconductor material having a second lattice constant greater than the first lattice constant.

In accordance with another embodiments, a fin field effect transistor (FinFET) comprises a substrate comprising a major surface; a fin structure protruding from the major surface comprising a lower portion, an upper portion, and a middle portion between the lower portion and upper portion, wherein the fin structure comprises a first semiconductor material having a first lattice constant; a pair of notches extending into opposite sides of the middle portion; a semiconductor liner adjoining the lower portion comprising a second semiconductor material having a second lattice constant greater than the first lattice constant; and an isolation structure surrounding the semiconductor liner, wherein a top surface of the isolation structure is higher than an interface of the semiconductor liner and one of the pair of notches.

In accordance with another embodiments, a method of fabricating a fin field effect transistor comprises providing a substrate; forming a fin structure protruding from a major surface of the substrate comprising a lower portion, an upper portion, and a middle portion between the lower portion and upper portion, wherein the fin structure comprises a first semiconductor material having a first lattice constant; epi-growing a second semiconductor material covering the fin structure, wherein the second semiconductor material has a second lattice constant greater than the first lattice constant; forming a shallow trench isolation (STI) region surrounding the second semiconductor material; recessing a first portion of the STI region to expose a first portion of the second semiconductor material; removing the first portion of the second semiconductor material to expose the upper portion; recessing a second portion of the STI region to expose a second portion of the second semiconductor material; and performing an oxidation process to the second portion of the second semiconductor material to form a pair of notches extending into opposite sides of the middle portion, wherein the remaining second semiconductor material forms a semiconductor liner.

In a general aspect, embodiments described herein may provide for a method that includes forming a fin structure extending from a semiconductor substrate and forming a semiconductor liner on a lower portion of sidewalls of the fin structure, The method further includes forming an isolation structure on sidewalls of the semiconductor liner, the isolation structure having a topmost surface below a topmost surface of the semiconductor liner, and oxidizing the semiconductor liner to form oxidized regions extending from an outer sidewall of the semiconductor liner to the sidewalls of the fin structure.

In another general aspect, embodiments described herein may provide for a method including providing a substrate, and forming a plurality of fin structures extending from a top surface of the substrate, each fin structure including a first portion closest to the top surface, a second portion furthest from the top surface, and a third portion interjacent the first portion and third portion, wherein the fin structures comprise a first semiconductor material. The method further includes growing a second semiconductor material on the plurality of fin structures. The second semiconductor material is lattice mismatched to the first semiconductor material. The method also includes depositing a dielectric layer between individual ones of the plurality of fin structures; recessing a first portion of the dielectric layer to expose a first portion of the second semiconductor material, and removing the first portion of the second semiconductor material to expose the third portion of the fin structures. The method yet further includes recessing a second portion of the dielectric layer to expose a second portion of the second semiconductor material, and oxidizing the second portion of the second semiconductor material to form a notch extending into the third portion of the fin structures.

In yet another general aspect, embodiments described herein may provide for a device that includes a semiconductor substrate, and a fin structure on the semiconductor substrate, the fin structure including a lower portion, an upper portion, and a middle portion between the lower portion and upper portion. The device further includes an oxide notch extending from a sidewall of the middle portion into the middle portion, and a semiconductor liner lining the lower portion, the semiconductor liner being lattice mismatches to the lower portion.

One general aspect of embodiments disclosed herein includes a device including: a semiconductor substrate; a fin structure on the semiconductor substrate, the fin structure including a lower portion, an upper portion, and a middle portion between the lower portion and upper portion; an oxide notch extending from a sidewall of the middle portion into the middle portion; and a semiconductor liner lining the lower portion, the semiconductor liner being lattice mismatched to the lower portion Another general aspect of embodiments disclosed herein includes a fin field effect transistor (FinFET) including: a substrate having a major surface; a fin structure protruding from the major surface, the fin including a lower portion, an upper portion, and a middle portion between the lower portion and upper portion, where the fin structure includes a first semiconductor material having a first lattice constant; an oxide notch extending from a sidewall of the middle portion into the middle portion; and a semiconductor liner adjoining the lower portion, the semiconductor liner including a second semiconductor material having a lattice constant different than the first lattice constant.

Yet another general aspect of embodiments disclosed herein includes a fin field effect transistor (FinFET) including: a substrate including a major surface; a fin structure protruding from the major surface, the fin including a lower portion, an upper portion, and a middle portion between the lower portion and upper portion, where the fin structure includes a first semiconductor material having a first lattice constant; a semiconductor liner adjoining the lower portion including a second semiconductor material having a second lattice constant greater different than the first lattice constant; and an oxide region material extending from a sidewall of the middle portion and extending into the fin structure.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A device comprising: a semiconductor substrate; a fin structure extending from the semiconductor substrate, the fin structure including a lower portion, an upper portion, and a middle portion between the lower portion and upper portion, wherein the lower portion includes outermost sidewalls; an oxide notch extending from a sidewall of the middle portion into the middle portion; and a semiconductor liner contacting the outermost sidewalls of the lower portion, the semiconductor liner being lattice mismatched to the lower portion.

2. The device of claim 1, wherein the fin structure has a first lattice constant and the semiconductor liner has a second lattice constant greater than the first lattice constant.

3. The device of claim 1, wherein the oxide notch comprises SiGeOx or SiGeBOy.

4. The device of claim 1, wherein the oxide notch comprises a pair of oxide notches extending inward from respective sidewalls of the middle portion when viewed from a cross-sectional view of the fin structure.

5. The device of claim 1, wherein the semiconductor liner extends across the semiconductor substrate.

6. The device of claim 1, wherein the semiconductor liner comprises SiGe or SiGeB.

7. The device of claim 1, further comprising shallow trench isolation material surrounding the lower portion and surrounding part of the middle portion.

8. The device of claim 7, wherein the oxide notch extends from above a topmost surface of the shallow trench isolation material to below the topmost surface of the shallow trench isolation material.

9. The device of claim 1, wherein the semiconductor liner has a thickness of from about 0.5 nm to about 2 nm.

10. A fin field effect transistor (FinFET) comprising: a substrate having a major surface; a fin structure protruding from the major surface, the fin comprising a lower portion, an upper portion, and a middle portion between the lower portion and upper portion, wherein the fin structure comprises a first semiconductor material having a first lattice constant; a semiconductor liner adjoining the lower portion and the middle portion, the semiconductor liner comprising a second semiconductor material having a lattice constant different than the first lattice constant, and an oxide notch extending through the semiconductor liner and into the middle portion of the fin structure.

11. The FinFET of claim 10, wherein the oxide notch comprises an oxide of the first semiconductor material.

12. The FinFET of claim 10, wherein the semiconductor liner extends across the major surface.

13. The FinFET of claim 10, wherein a first thickness of the semiconductor liner is less than a second thickness of one of the oxide notch.

14. The FinFET of claim 10, further comprising shallow trench isolation material surrounding the lower portion and surrounding part of the middle portion.

15. The FinFET of claim 14, wherein the oxide notch extends from above a topmost surface of the shallow trench isolation material to below the topmost surface of the shallow trench isolation material.

16. A fin field effect transistor (FinFET) comprising:
a substrate comprising a major surface;
a fin structure protruding from the major surface, the fin comprising a lower portion, an upper portion, and a middle portion between the lower portion and upper portion, wherein the fin structure comprises a first semiconductor material having a first lattice constant;
a semiconductor liner conformally covering a sidewall of the lower portion, the semiconductor liner comprising a second semiconductor material having a second lattice constant greater than the first lattice constant; and
an oxide region material extending from a sidewall of the middle portion and extending into the fin structure.

17. The FinFET of claim 16, wherein the first semiconductor material comprises silicon and the second semiconductor material comprises silicon-germanium.

18. The FinFET of claim 16, wherein the oxide region comprises an oxide of silicon germanium.

19. The FinFET of claim 16 further comprising a dielectric material adjacent the fin structure, wherein the oxide region extends from above a topmost surface of the dielectric material to below the topmost surface of the dielectric material.

20. The FinFET of claim 16, further comprising a second fin structure, wherein the semiconductor liner extends from the fin structure to the second fin structure.

* * * * *